United States Patent [19]

Tullis et al.

[11] Patent Number: 4,532,970
[45] Date of Patent: Aug. 6, 1985

[54] PARTICLE-FREE DOCKABLE INTERFACE FOR INTEGRATED CIRCUIT PROCESSING

[75] Inventors: Barclay J. Tullis, Palo Alto; Mihir Parikh, San Jose; David L. Thrasher, Menlo Park; Mark E. Johnston, Saratoga, all of Calif.

[73] Assignee: Hewlett-Packard Company, Palo Alto, Calif.

[21] Appl. No.: 536,600

[22] Filed: Sep. 28, 1983

[51] Int. Cl.³ .............................................. B65B 1/04
[52] U.S. Cl. ................................... 141/98; 220/20.5; 414/217
[58] Field of Search ........................ 141/98, 319–323, 141/346, 383–386, 91, 92, 4–8; 220/20.5, 23, 256; 188/500; 414/217, 221, 292

[56] References Cited

U.S. PATENT DOCUMENTS

| | | | |
|---|---|---|---|
| 3,260,381 | 7/1966 | Wagner et al. | 414/292 |
| 3,294,670 | 12/1966 | Charschan et al. | 414/217 X |
| 4,047,624 | 9/1977 | Porenbos | 414/217 |
| 4,089,341 | 5/1978 | Okaya | 137/68 R |
| 4,201,310 | 5/1980 | Glachet | 220/256 |
| 4,260,312 | 4/1981 | Hackney | 414/292 |
| 4,281,691 | 8/1981 | Goutard et al. | 141/98 |

FOREIGN PATENT DOCUMENTS

938311  10/1963  United Kingdom ................ 414/292

Primary Examiner—Stephen Marcus
Assistant Examiner—Ernest G. Cusick
Attorney, Agent, or Firm—Jeffery B. Fromm

[57] ABSTRACT

A particle-free dockable interface is disclosed for linking together two spaces each enclosing a clean air environment. The interface is composed of interlocking doors on each space which fit together to trap particles which have accumulated from the dirty ambient environment on the outer surfaces of the doors.

1 Claim, 11 Drawing Figures

PARTICLE-FREE DOCKABLE INTERFACE FOR INTEGRATED CIRCUIT PROCESSING

BACKGROUND

Processing yield has long been a major concern in integrated circuit (IC) manufacturing. A major cause of IC processing failures is the existence of particles such as dust in the processing environment. Conventional IC processing is therefore done in a clean room in which the air is continuously circulated and filtered in an attempt to remove the airborne particles. In addition, personnel are usually clothed in special suits in an attempt to reduce the number of particles introduced as the workers move about the clean room. As a final step, many of the most vulnerable IC process steps are further contained beneath laminar flow down-drafts of filtered air to provide added protection from local sources of particulate contamination.

Unfortunately such an environment suffers from several disadvantages. First, such specially designed rooms are not only fairly expensive to construct and maintain, but also working in such an environment is inconvenient. Second, since the size of particles which will cause product failure is usually equal to or greater than $\frac{1}{4}$ to $\frac{1}{3}$ the minimum feature size of the product, it is necessary to continually reduce contamination levels as dimensions are reduced in newer IC products in order to maintain acceptable process yields. This problem becomes especially acute as the minimum feature size drops below one micron for very large scale integrated (VLSI) ICs.

SUMMARY

The present invention is a departure from the use of a conventional clean room in the fabrication of ICs. Instead, a novel standardized mechanical interface (SMIF) system is utilized that reduces particle contamination by significantly reducing particle fluxes onto wafers. This is done by mechanically assuring that during transportation, storage, and most processing steps, the gaseous media surrounding the wafers is essentially stationary relative to the wafers, and that particles from exterior "ambient" environments cannot enter the wafer environments. Experiments have shown that the SMIF system of wafer handling reduces wafer particle contamination by as much as ten times when compared to conventional Class 100 clean room wafer handling practice. In addition, since the level of SMIF system particle contamination is independent of the ambient external environment, IC manufacturing can proceed in a non-clean facility. Thus, not only is the expense and inconvenience of a clean room eliminated, but also process yields can be maintained or even improved for high density VLSI processes due to the lower concentration of particle contamination.

Experiments have shown that a significant number of processing defects in VLSI circuits are caused by particles and that many of these particles are related to material handling by humans even if low-particle clothing is employed. A sitting person with light hand, forearm and head movements even with proper clean-room clothing will emit more than 100,000 particles/minute, all larger than 0.3 microns. The SMIF system therefore consists of two parts: (1) a clean gas filled canopy around the wafer handling apparatus of each piece of processing equipment; and (2) a small, clean, still-gas box to carry wafers from machine to machine. The various pieces of the system are mechanically interfaced without the need of an air-lock by means of unique particle-free dockable doors which consist of a door on each piece of equipment that fit together to trap particles which have accumulated from the dirty ambient environment on the outer surfaces of the doors. Once linked together, the doors are moved as a unit into the clean interior space, thus opening a particle-free interface between the system components. Wafers are then moved through the system by mechanical arms and elevators without human intrusion. The actual wafer movement can also be fully automated through the use of robotic material handlers to further increase productivity. Thus by eliminating human handling of IC wafers and maintaining the wafers in a still-air environment throughout the majority of the IC process, particles are reduced and process yield is increased.

DETAILED DESCRIPTION OF THE INVENTION

Conceptually, the SMIF system has two parts:

(1) a clean air canopy around the wafer handling apparatus of each piece of processing equipment; and (2) a small clean air box to carry wafers from machine to machine.

In practice, the SMIF system is built from several of the small clean air boxes and canopies to form SMIF subsystems, each of which are built from three SMIF subsystem components.

Figure 1:
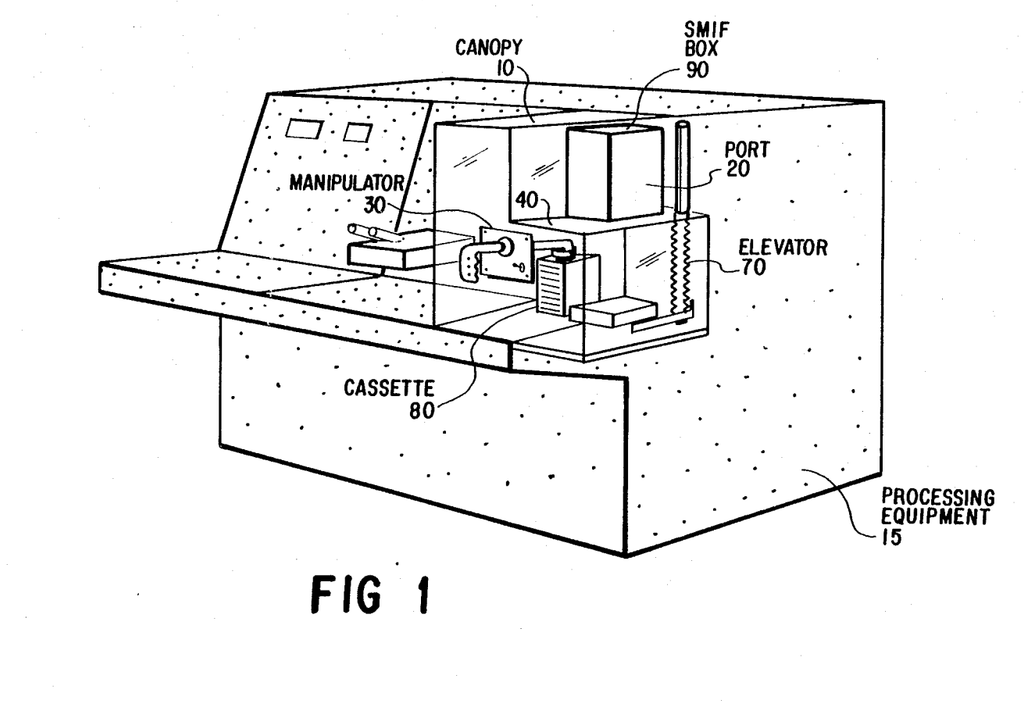
FIG. 1 shows a first SMIF subsystem component, a canopy, according to a preferred embodiment of the present invention.

The first SMIF subsystem component as shown in FIG. 1 is the canopy 10. The canopy 10 is an easily removable shield that covers the wafer handling mechanisms of each piece of processing equipment 15 (e.g., photoresist applicators, mask aligners, inspection equipment, etc.). Generally, the canopy 10 is constructed of transparent plastic such as Lexan to facilitate inspection and/or maintenance within the canopy 10 which may later become necessary. The other subsystem components are a SMIF cassette port 20 and a SMIF cassette manipulator 30 which are bolted onto the canopy 10 in locations that allow easy movement within the canopy 10. Because the canopy 10 encloses the handling mechanisms of the processing equipment 15, there is no need to enclose the processing equipment 15 within a clean room.

Figure 2A:
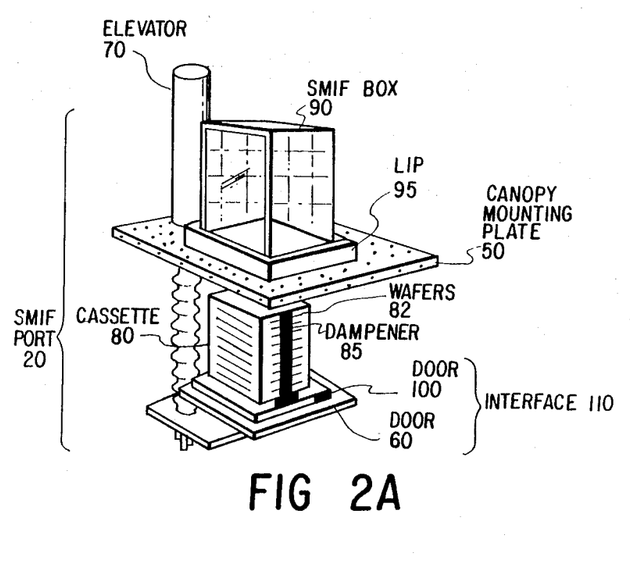
FIGS. 2A and 2B show a second SMIF subsystem component, a cassette port, according to a preferred embodiment of the present invention.
Figure 2B:
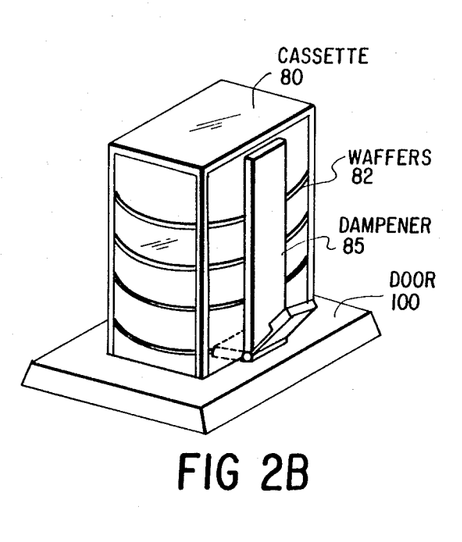

FIG. 2A shows the details of the SMIF cassette port 20. The port 20 is typically mounted on an horizontal surface 40 of the canopy 10 by means of a canopy mounting plate 50. The port 20 further consists of a port door 60 and an elevator mechanism 70 that transports a cassette 80 containing the IC wafers 82 into the interior of the canopy 10. The wafers 82 are held in the cassette 80 by a wafer dampener 85 as shown in FIG. 2B which is mounted to the door 100 and is activated by the weight of the cassette 80.

A SMIF box 90, which is used for transporting cassettes 80 from one piece of processing equipment 15 to another, interfaces with the canopy 10 via the SMIF port 20. The SMIF box 90 is aligned with the SMIF port 20 by means of a wedge shaped lip 95 and has a door 100 which interlocks with the door 60 on the port 20. Doors 60 and 100 together provide a particle-free dockable interface 110, shown in FIG. 2 in the open position, which will be described in detail shortly. The interface 110 also provides means to latch the box 90 to the port 20 so that the elevator mechanism 70 can freely transport the cassette 80 between the box 90 and the canopy 10. The doors 60 and 100 are designed so that the majority of particles on the exterior surfaces of the doors 60 and 100 are trapped between the doors 60 and 100. Thus, the wafers carried in the cassette 80 are not contaminated when the interface 110 is opened.

Figure 3A:
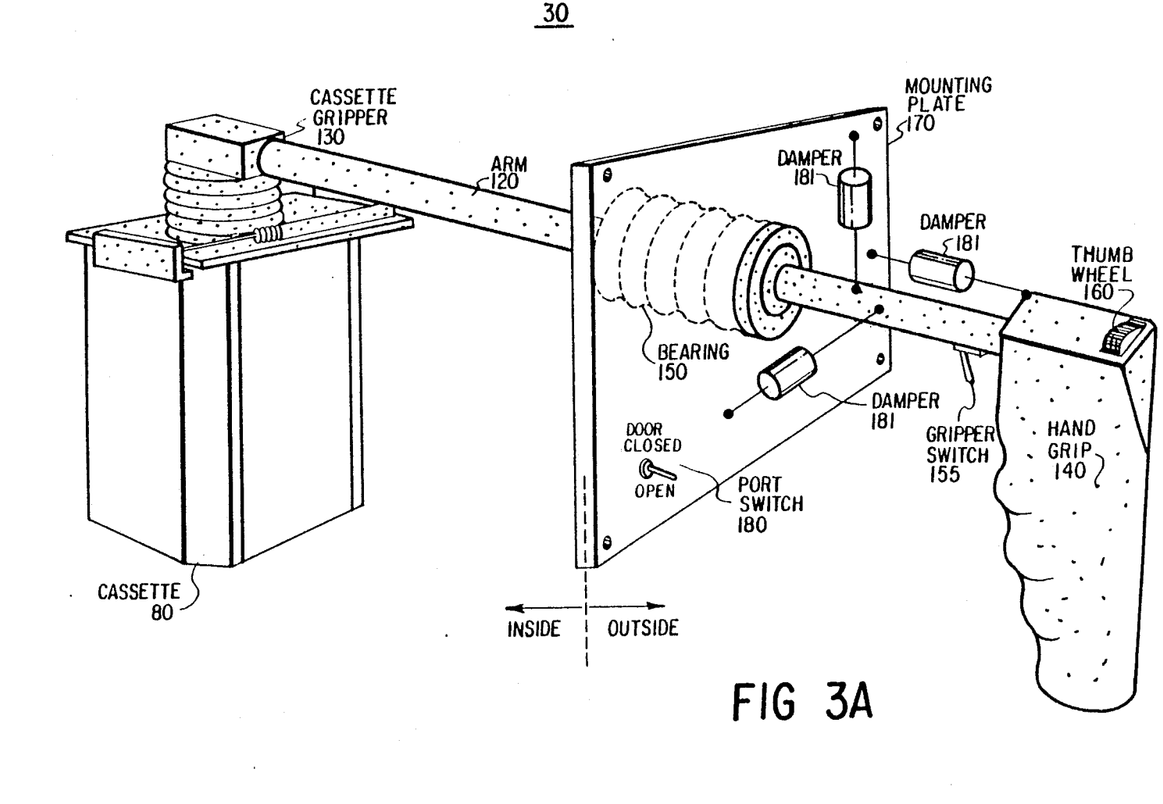
FIGS. 3A, 3B and 3C show three versions of a third SMIF subsystem component, a cassette manipulator, according to a preferred embodiment of the present invention.
Figure 3B:
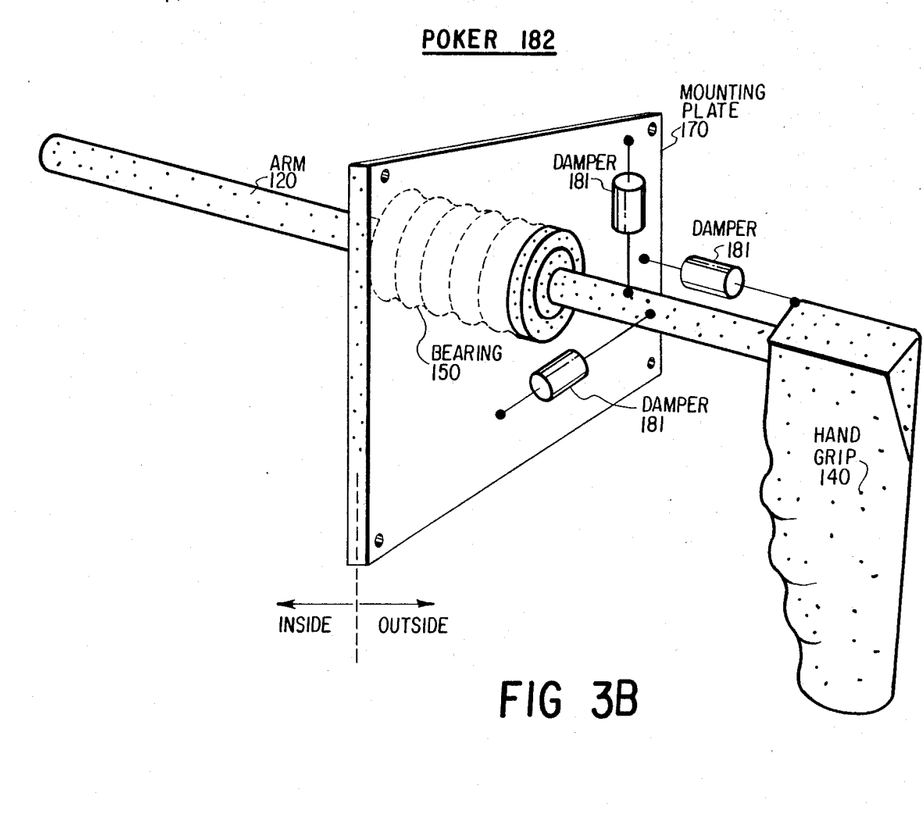
Figure 3C:
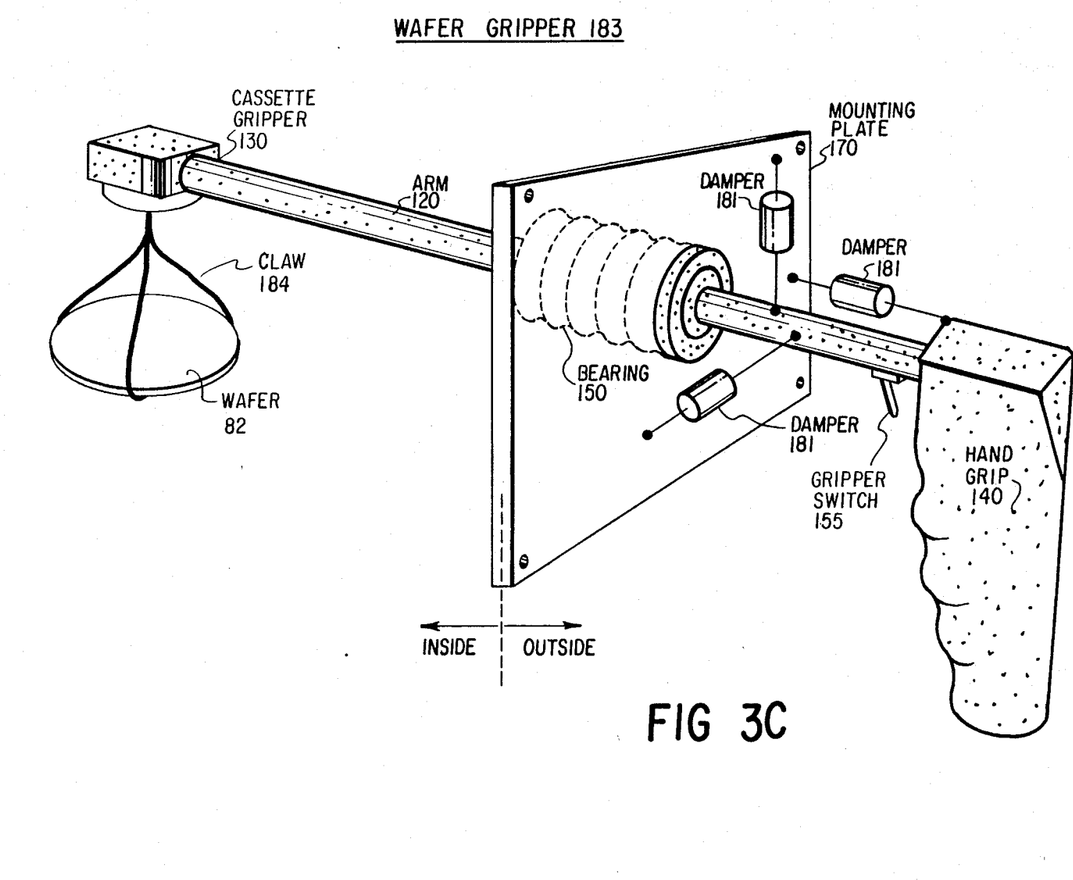

Once the cassette 80 is within the canopy 10, the cassette 80 can be maneuvered as needed by the cassette manipulator 30. A manually operated cassette manipulator 30 is shown in FIG. 3. The manipulator 30 typically has an arm 120 which is 2-3 feet long and a cassette gripper 130 on the inside (clean air) end and a hand grip 140 on the outside (ambient) end. A bearing 150 provides angular and in-out movement for the arm 120 as well as providing an air seal to prevent the intrusion of dirty ambient air. The cassette gripper 130 is actuated by gripper switch 155 to hold the cassette 80 which can then be rotated about the vertical axis by a thumb wheel 160 mounted on the hand grip 140. A manipulator mounting plate 170 supports the bearing 150 and a port actuation switch 180 which actuates the latching of doors 60 and 100 and the movement of the elevator mechanism 70. Mechanical dampers 181 are provided along the three axis of motion of arm 120 to limit the speed of the movement of the gripper 130. The manipulator mounting plate 170 is bolted to the canopy 10 as shown in FIG. 1. Two alternatives of the cassette manipulator 30 which are often useful are a poker 182 as shown in FIG. 3B and a wafer gripper 183 as shown in FIG. 3C. The poker 182 is a cassette manipulator 30 without a gripper 130 used to push objects within the canopy 10. The wafer gripper 183 is a cassette manipulator 30 with a three-pronged claw 184 or similar mechanism replacing the cassette gripper 130 so that the wafers can be grasped directly as needed.

It should be noted that both the canopy 10 and SMIF box 90 described above totally exclude humans and do not utilize constantly moving filtered air to decrease particles on the IC wafer surfaces. Rather, IC cleanliness is achieved by maintaining a still-air interior environment. The canopy 10 and box 90 can each be equipped with particle-filtered openings 11 and 91 respectively, (see FIG. 4) to allow continuous equalization between internal and external (ambient) air pressures. Such filtered pressure equalization openings 11 and 91 minimize pressure difference and air flow between the canopy 10 and box 90 as the interface 110 is opened and the wafers are moved from the box 90 into the canopy 10. In addition, access to the interiors of the canopy 10 and box 90 are by means of mechanical arms which occupy essentially constant volume within the enclosures so that there is no significant change in interior volume as IC wafers are moved about. Hence, since there is little or no change of interior air pressure during processing, there is no need for air-tight seals on the canopy 10 or box 90, and particles on the IC wafer surfaces are further decreased by inhibiting the movement of air.

Figure 4:
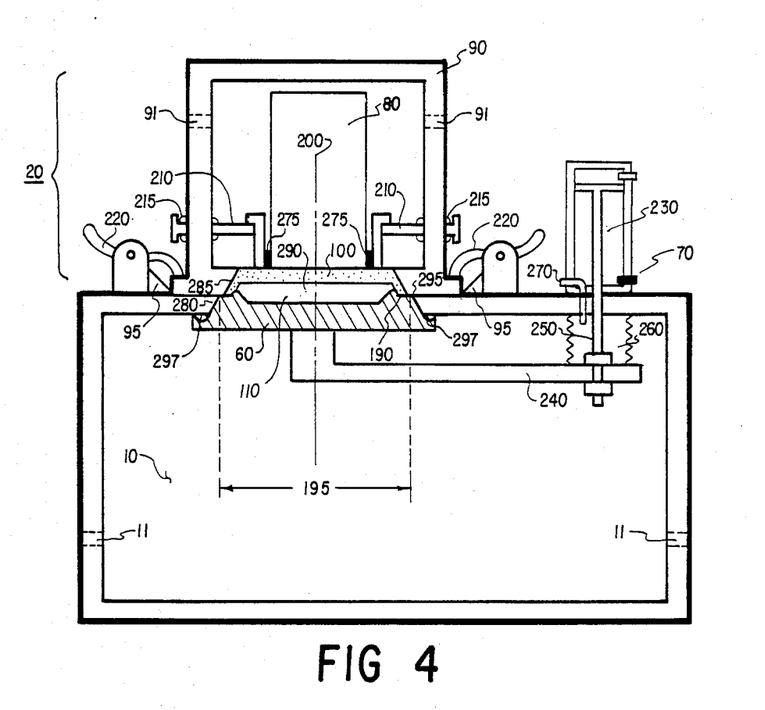
FIG. 4 shows the canopy interfaced to the cassette port according to a preferred embodiment of the present invention.
Figure 5:
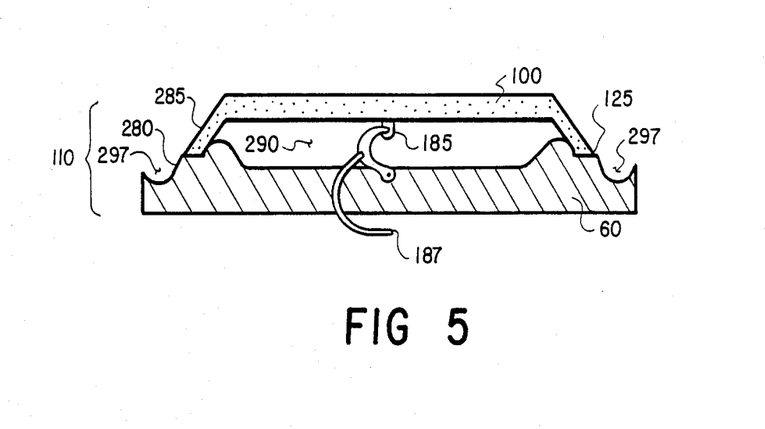
FIG. 5 shows an alternative embodiment of an interface as shown in FIG. 4.

FIG. 4 shows a vertically opened version of the SMIF cassette port 20. A horizontally opened version is also easily achieved by slight mechanical modifications to the vertically opened version to include a positive spring loaded latch 185 and release cable 187 as shown in FIG. 5 between the doors 60 and 100 since gravity cannot be used to hold the doors together. The cassette box 90 is designed to contain one cassette 80 and is only slightly larger than the cassette 80 itself, which holds the IC wafers. The cassette box 90 will generally have transparent sides to facilitate observations by humans which may be necessary. The particle-free dockable interface 110 mentioned earlier permits clean, particle-free access between two otherwise independent clean environmental systems such as the canopy 10 and the SMIF box 90. The interface 110 avoids letting air-borne particles, especially those in the size range between 0.1 to 20 microns, from entering the otherwise clean equipment containers.

FIG. 4 shows the interconnection of the envelopes of the closed spaces 10 and 90 along a contact area 190. In the present invention it is necessary to open the contact area 190 without exposing the spaces 10 and 90 to the external environment or to the previously external surfaces of doors 60 and 100 of spaces 10 and 90 respectively. In particular, when the doors 60 and 100 are opened, the portions of the external surfaces of the contact area 190 lying within the contact opening 195 are made to contact one another thereby trapping particles which may exit on the external surfaces between the doors 60 and 100. The contact area 190 is then kept in contact while the doors 60 and 100 are moved as a single unit into the space 10.

The doors 60 and 100 are either circularly or rectangularly symmetrical about axis 200. Before the interface 110 is opened, door 100 is held in place by latches 210 which pass through the walls of spaces 90 by means of airtight bearings or bushings 215. Spaces 10 and 90 are held together in lip 95 by clamp 220. In the specific embodiment shown in FIG. 4, a piston 230 of the elevator 70 is located outside of spaces 10 and 90 to conserve space within the enclosures. Piston 230 is coupled to door 60 by an arm 240 and rod 250. The rod 250 passes through the wall of space 10 by means of a bellows 260 which prevents the intrusion of dirty ambient air. A vent 270 is provided to allow the equalization of air pressure inside of bellows 260 as the elevator 70 moves and the bellows 260 expands and contracts. Note that the air passing through vent 270 is dirty ambient air, but this does not contaminate space 10 because the bellows is sealed to the inside of space 10 and arm 250. To open the interface 110, latches 210 are released, piston 230 is extended, and the elevator 70 transports both doors 60 and 100 as a unit into space 10, thereby carrying the cassette 80 aligned with the aid of guide lips 275 into space 10 while trapping surface particles between the two doors 60 and 100 and preventing the intrusion of dirty ambient air.

In order to trap surface particles between doors 60 and 100 it is only necessary that the doors contact each other uniformly and closely around their outer perimeters 280 and 285 respectively. The doors 60 and 100 need not fit flush with each other along the entire interface 110. In fact, it is desirable that an air gap 290 inside of the outer perimeters 280 and 285 be left between the doors 60 and 100. The air gap 290 provides a compressive air space between the doors 60 and 100 so that the dirty air trapped between the doors 60 and 100 does not rush out at high velocity in the plane perpendicular to axis 200 as the doors 60 and 100 are brought together, thereby potentially sweeping part of the dirty trapped air into spaced 10 or 90. The air gap 290 also prevents doors 60 and 100 from becoming affixed together by air pressure as could occur if the contact area 190 was a large, closely fitting surface. Typically the air gap 290 will occupy more than 80% of the contact opening 195.

Ideally, the doors 60 and 100 should fit together so that perimeters 280 and 285 form one continuous surface. Therefore, joggle 295 where perimeters 280 and 285 meet should be kept as small as possible (e.g., less than 0.010–0.020 inch) since particles on the joggle 295 will be brought within the clean spaces 10 and 90 when the interface 110 is opened. Some particles may be present on the perimeters 280 and 285 so a particle gutter 297 is provided on door 60 to catch any particles which might roll down the perimeters 280 and 285 when the interface 110 is opened. Alternatively, particle gutter 297 can be omitted to permit any particles from the perimeters 280 and 285 to settle all the way to the bottom of the canopy 10.

Figure 6:
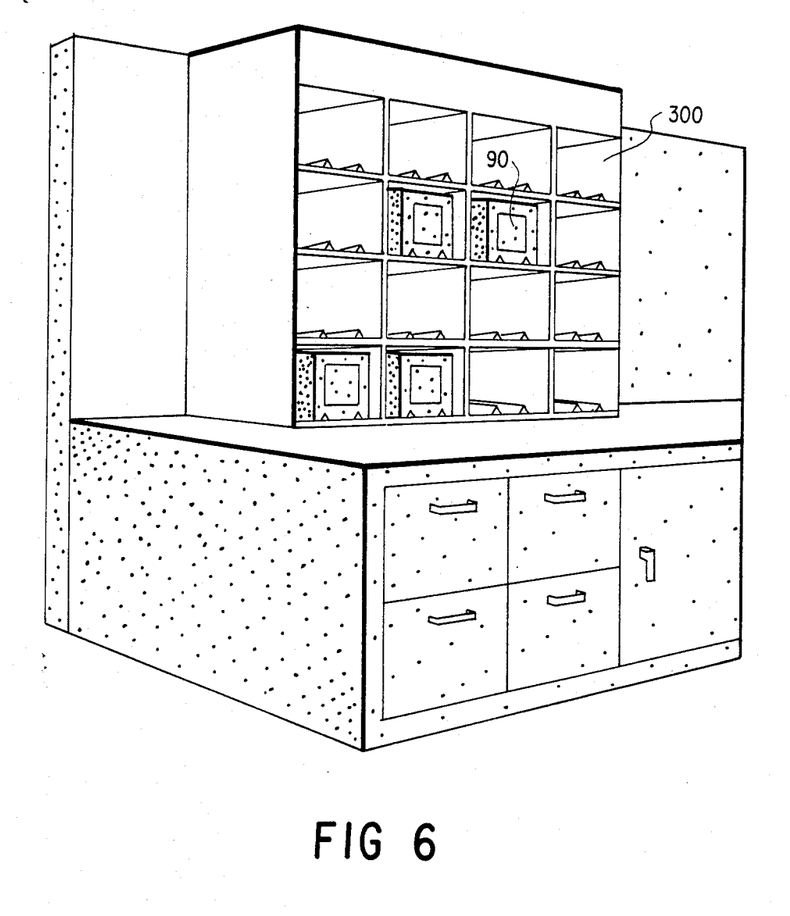
FIG. 6 shows a SMIF box storage unit according to a preferred embodiment of the present invention.

FIG. 6 shows a SMIF box storage unit 300. The box storage unit 300 is basically an open rack for storing cassette boxes 90.

Figure 7:
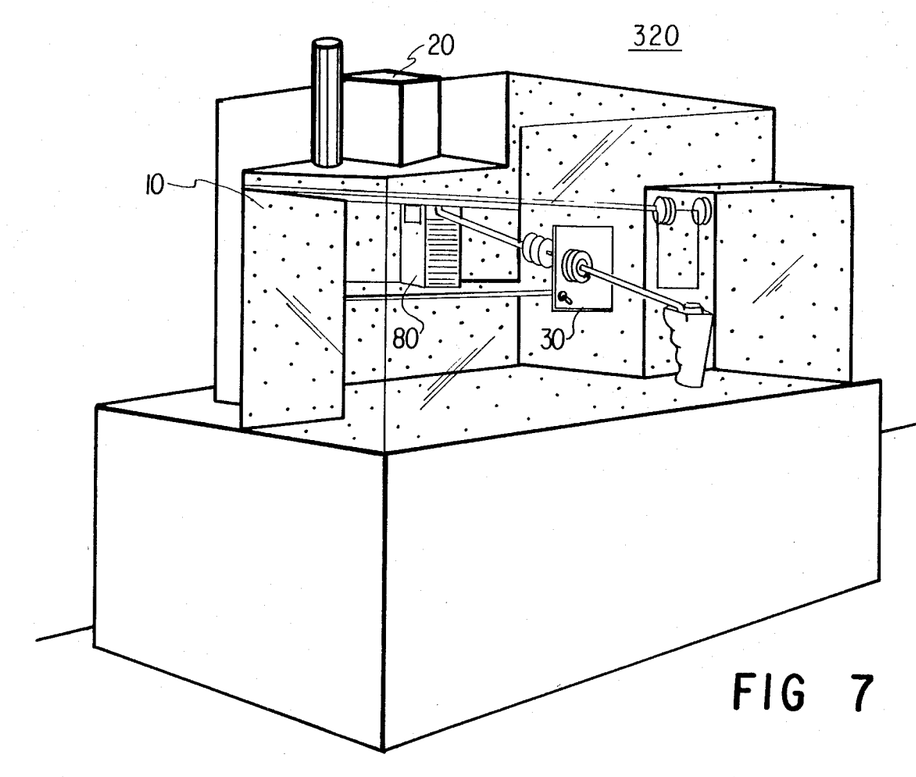
FIG. 7 shows a cassette storage unit according to a preferred embodiment of the present invention.

FIG. 7 shows a cassette storage unit 320 for storing cassettes 80 holding IC wafers. The cassette storage unit 320 is a desiccator box with a canopy 10, port 20, and manipulator 30 added to it. The cassette storage unit 320 will typically function as a cassette processing buffer.

Figure 8:
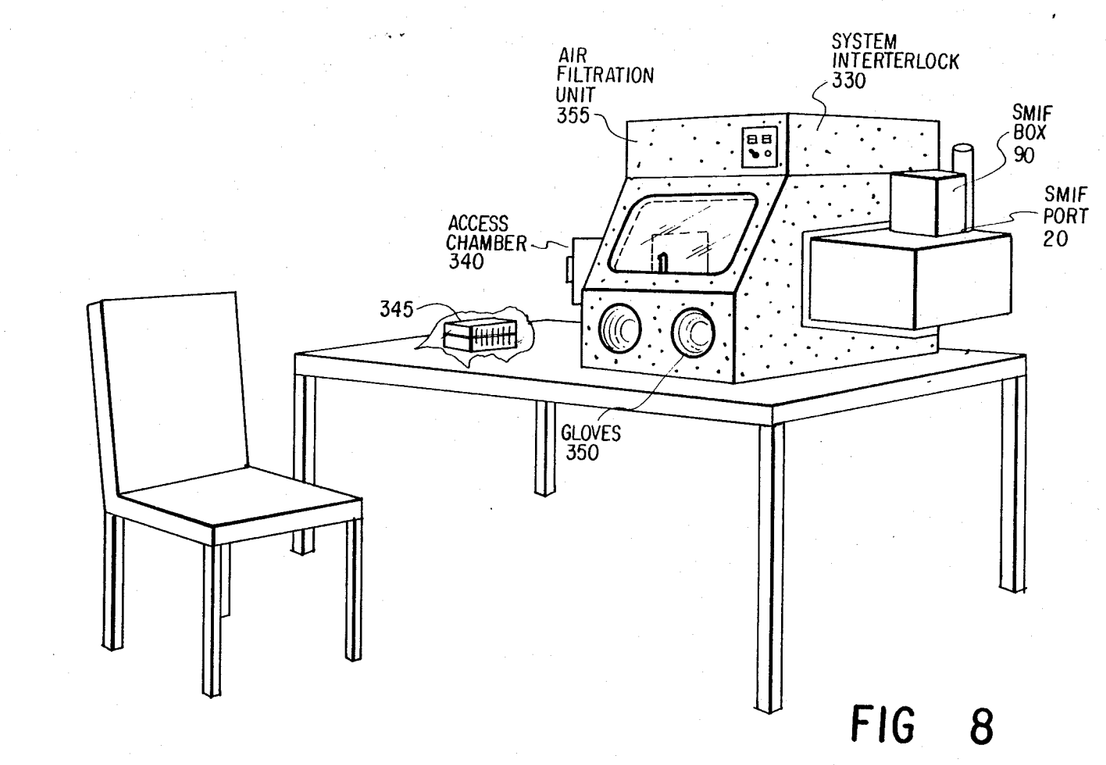
FIG. 8 shows a system interlock according to a preferred embodiment of the present invention.

Initial cassette entry into the SMIF system occurs through the system interlock 330 as shown in FIG. 8. This is typically a four-foot wide glove box with an access chamber 340 at one end and a SMIF port 20 at the other end. The complex movements required to transfer wafers from a new wafer package 345 into a cassette (not shown) necessitates the use of gloves 350 rather than mechanisms. Cassettes 80 and wafers enter and leave the SMIF system through the access chamber 340. Note that since the internal pressure of the system interlock 330 can change abruptly as human arms are thrust in and out of the gloves 350, it is necessary that the system interlock 330 be tightly constructed to prevent the intrusion of outside unfiltered air and it is also necessary to utilize an air filtration unit 355 on the system interlock 330. The air filtration unit 355 can contain both a conventional forced air filter and/or a particle collector such as an electrostatic precipitator. Although generally less desirable from a particle contamination standpoint than using mechanical manipulators 30 on the canopy 10 as shown in FIG. 1, gloves 350 could be used to provide further flexibility of motion within canopy 10. Such gloves 350 are especially useful to provide maintenance within canopy 10 during periods when no IC wafers are present which can be contaminated by the intrusion of outside unfiltered air caused by use of the gloves 350. Filtration units 355 could also be used on the canopy 10 during such maintenance periods to remove any particles which may have intruded.

Because ICs are transported in their own closed containers and handling is done by mechanical arms it is also possible to fully automate the IC production facility by the use of stationary or mobile robots which use computer controlled robotic manipulators coupled to the SMIF components. Whether handling is done manually or automatically, by combining the SMIF components with conventional IC processing equipment the IC fabrication area can for the first time be constructed without the need of a conventional clean room environment, while at the same time improving IC cleanliness.

We claim:
1. An interface between first and second containers comprising:
   alignment means for orienting the first container in a fixed position relative to the second container;
   a first door for independently sealing the first container;
   a second door for independently sealing the second container;
   said first and second doors each having a closely contacting mating outer surface of substantially equal exterior dimensions, so that substantially all particulate contamination which has accumulated on the exterior surface of the doors when the containers are separated will be trapped between said doors when the containers are positioned together with said alignment means;
   a gutter around the lower perimeter of the lower of the first and second doors; and
   elevator means coupled to said doors for transporting said doors while coupled together at their mating outer surfaces into said containers as a single unit.

* * * * *